United States Patent [19]

Butt et al.

[11] Patent Number: 4,761,518

[45] Date of Patent: Aug. 2, 1988

[54] CERAMIC-GLASS-METAL PACKAGING FOR ELECTRONIC COMPONENTS INCORPORATING UNIQUE LEADFRAME DESIGNS

[75] Inventors: Sheldon H. Butt, Godfrey, Ill.; William F. Cann, Ladue, Mo.

[73] Assignee: Olin Corporation, New Haven, Conn.

[21] Appl. No.: 4,469

[22] Filed: Jan. 20, 1987

[51] Int. Cl.[4] ............................................. H01L 23/08
[52] U.S. Cl. ............................... 174/52 FP; 437/217; 357/74
[58] Field of Search .............. 174/52 FP; 357/70, 73, 357/74; 437/215, 217, 218, 219, 220

[56] References Cited

U.S. PATENT DOCUMENTS 3,781,457  12/1973  McKerreghan ............... 174/52 FP
4,491,622   1/1985  Butt .
4,569,692   2/1986  Butt .

Primary Examiner—Arthur T. Grimley
Assistant Examiner—David A. Tone
Attorney, Agent, or Firm—Gregory S. Rosenblatt; Paul Weinstein

[57] ABSTRACT

A semiconductor casing is formed of a ceramic-glass-metal composite material with a leadframe embedded in a base component. The leadframe may include holes therethrough to mechanically interlock with the composite material. Also, a process comprises forming a four-sided semiconductor casing having a leadframe with an aluminum cladding that is etched away at the ends extending from the casing.

27 Claims, 1 Drawing Sheet

CERAMIC-GLASS-METAL PACKAGING FOR ELECTRONIC COMPONENTS INCORPORATING UNIQUE LEADFRAME DESIGNS While the invention is subject to a wide range of applications, it is especially suited for use in fabricating leadframe designs which are embedded in and interlock with ceramic-glass-metal package components. In addition, a process is disclosed for using an aluminum clad leadframe in a four-sided ceramic-glass-metal package. The invention discloses the bonding together of ceramic particles to form a coherent composite with desired properties which may be specfically tailored for specific applications in the packaging of electronic components.

This application relates to U.S. Pat. No. 4,569,692, entitled LOW THERMAL EXPANSIVITY AND HIGH THERMAL CONDUCTIVITY SUBSTRATE, by S. H. Butt; U.S. patent application Ser. No. 838,866, filed Mar. 12, 1986 entitled CERMET SUBSTRATE WITH GLASS ADHESION COMPONENT, by D. Mahulikar (now abandoned); U.S. patent application Ser. No. 838,967, filed Mar. 12, 1986, entitled CERMET SUBSTRATE WITH SPINEL ADHESION, by M. J. Pryor et al.; U.S. patent application Ser. No. 924,959, filed Oct. 30, 1986, entitled PRODUCTS FORMED OF CERAMIC-GLASS-METAL COMPOSITES, by N. N. SinghDeo et al.; U.S. patent application Ser. No. 924,968, filed Oct. 30, 1986, entitled CERAMIC-GLASS-METAL COMPOSITE by Mahulikar et al.; U.S. patent application Ser. No. 924,970, filed Oct. 30, 1986, entitled ELECTRONIC PACKAGING OF COMPONENTS INCORPORATING A CERAMIC-GLASS-METAL COMPOSITE, by N. N. SinghDeo et al.; U.S. patent application Ser. No. 707,636, filed Mar. 4, 1985 entitled PIN GRID ARRAY, by M. J. Pryor (now abandoned), corresponding to EPO Publication No. 0193782; U.S. Pat. No. 4,715,892, entitled CERMET SUBSTRATE WITH GLASS ADHESION COMPONENT, by D. Mahulikar; U.S. patent application Ser. No. 413,046, Aug. 30, 1982, entitled "MULTI-LAYER CIRCUITRY" by Sheldon H. Butt, corresponding to EPO Publication No. 0101791; U.S. patent application Ser. No. 651,984, filed Sept. 19, 1984, entitled "SEALING GLASS COMPOSITE" by Edward F. Smith, III (now abandoned), corresponding to EPO Publication No. 0175361; U.S. patent application Ser. No. 651,987, filed Sept. 19, 1984, entitled "SEALING GLASS COMPOSITE" by Edward F. Smith, III et al. (now abandoned); U.S. patent application Ser. No. 811,908, filed Dec. 20, 1985, entitled "STEEL SUBSTRATE WITH BONDED FOIL" by Richard A. Eppler (now abandoned); U.S. Pat. No. 4,712,161, entitled "HYBRID AND MULTI-LAYER CIRCUITRY" by Michael J. Pryor et al.; U.S. patent application Ser. No. 811,911, filed Dec. 20, 1985, entitled "A HERMETICALLY SEALED PACKAGE" by Michael J. Pryor et al.; U.S. Patent Application Ser. No. 811,910, filed Dec. 20, 1985, entitled "A METHOD OF JOINING METALLIC COMPONENTS" by Michael J. Pryor et al.; U.S. Pat. No. 4,696,851, entitled "HYBRID AND MULTI-LAYER CIRCUITRY" by Michael J. Pryor et al.; U.S. patent application Ser. No. 811,906, filed Dec. 20, 1985, entitled "MULTI-LAYER AND PIN GRID ARRAYS" by Michael J. Pryor; U.S. Pat. No. 4,491,622, entitled "COMPOSITES OF GLASS-CERAMIC TO METAL SEALS AND METHOD OF MAKING THE SAME" by Sheldon H. Butt; U.S. patent application Ser. No. 22,895, filed Mar. 6, 1987, entitled "CERMET COMPOSITE" by Narendra N. SinghDeo; U.S. patent application Ser. No. 2,532, filed Jan. 12, 1987, entitled "PROCESS FOR PRODUCING FORMABLE AND HIGH STRENGTH LEADFRAMES FOR SEMICONDUCTOR pACKAGES" by Deepak Mahulikar et al.; and U.S. Patent Application Ser. No. 811,846, filed Dec. 20, 1985, entitled "METAL-GLASS LAMINATE" by Charles J. Leedecke et al.

The present invention is directed to components and methods of producing components for improving the ceramic dual-in-line packages (CERDIP) as well as the ceramic four-sided packages (CERQUAD) technologies. Currently, the ceramic package technology utilizes a ceramic base and lid. Typically, the base and lid are manufactured from an alumina base ceramic mixture which is hot pressed into the configuration of bases and lids. The hot pressed components are then sintered into a homogeneous mass having suitable mechanical properties and being resistant to breakage.

Next, multiple layers of a glass frit with a low melting temperature are silk screened upon surfaces of the components which are later to be glass sealed. A drying operation follows each glass screening operation until the applied glass is sufficiently thick to surround the leadframe. Next, the glass is sintered.

The components with thick sintered glass on their sealing surfaces are normally shipped from the component manufacturer to the user. The final user typically places a leadframe on the glazed surface and heats the components to sink or embed the leadframe into the glazed surface. At this stage, a semiconductor die is mounted in a cavity formed in the base. Electrical interconnections, generally with aluminum lead wires, are now made between the die and the tips of the leadframe. The final operation usually entails placing a glazed cover upon the preliminary assembly, and heating the assembly again to reflow the glass and hermetically seal the package.

The leadframes are typically manufactured from a low expansivity iron-nickel alloy, such as 42 Nickel-58 Iron. With CERDIP'S, the leadframes are manufactured from an aluminum striped strip. The aluminum stripe may be applied by any conventional technique such as by a roll cladding process or a vapor deposition process. The aluminized surface is needed in the areas to which the aluminum wires are subsequently bonded. The purpose of aluminizing the surface is to prevent development of an undesirable intermetallic at the interface between the aluminum wires and the lead tips. In the case of four-sided ceramic packages (CERQUAD'S), the central area of the leadframe where aluminization is required is spot coated by a difficult and costly step of vapor deposition. This is necessary because solder does not bond to aluminum. Therefore, the aluminum has to be essentially absent from the external leads before soldering them in place. Etchants, normally used to remove the aluminum usually agressively attack the sealing glass. Therefore, the external leads which protrude from glass sealed packages are typically not provided with the aluminum stripe.

The sealant, usually a solder glass, seals the package at a relatively low temperature, i.e. about 470° C. The metallic leadframe is embedded in the glass sealant. The strength of the CERDIP seal depends on the strength of the glass sealant, the length and width of the seal, the presence of pores or other discontinuities and eventually the nature of the bond between the glass and the metallic leadframe. Usually, the glass is the weakest component of the CERDIP package. The adhesion between the leadframe and the glass sealant is relatively poor in most package designs. If the seals are subjected to significant mechanical or thermo-mechanical loading, the seal can readily fail.

The CERDIP designs have been modified to compensate for their inherent weakness. They have a larger seal area as compared to a side brazed package of the same size. The result is a die cavity of reduced width as compared with that of the side brazed package. In instances where the size of the space to accommodate the package is limited, larger chips which cannot be fit within the reduced sized die cavity of a CERDIP, require mounting in a more expensive side brazed ceramic package.

In U.S. patent application Ser. No. 924,970 the strength of the CERDIP design was improved by removing the leadframe from the interior of the glass seal and embedding it to the base or lid of the package. The resulting superior package does not transmit stress into the seal from flexure of the leads which routinely occurs during the handling of the package. At the same time, the size of the die cavity may be enlarged so that the package competes in reliability with the sidebrazed package but at a much lower cost.

It is a problem underlying the present invention to manufacture electronic packaging with components incorporating a ceramic-glass-metal composite and having improved leadframe bond strength whereby the leadframe is strongly bonded into the package and can include an aluminum stripe.

It is an advantage of the present invention to provide electronic packaging with components incorporating a ceramic-glass-metal composite and a method of forming the composite which obviates one or more of the limitations and disadvantages of the described prior arrangements.

It is a still further advantage of the present invention to provide electronic packaging with components incorporating a ceramic-metal-glass composite and to embed a metal leadframe into one of the components.

It is a yet further advantage of the present invention to provide electronic packaging with components incorporating a ceramic-metal-glass composite and to embed a leadframe having an aluminum stripe.

It is yet another advantage of the present invention to provide electronic packaging for components incorporating a ceramic-metal-glass composite and to embed a leadframe having a mechanical interlock with the composite forming the base and/or lid.

Accordingly, there has been provided components and the process of forming the components for housing semiconductor devices. The components are formed of a unique ceramic-glass-metal composite material comprising ceramic particles, metallic particles dispersed throughout the composite and a glassy phase for adhering the ceramic and metallic particles together. A leadframe is embedded within the composite material and may include holes therethrough to form a strong mechanical interlock between the composite material and the leadframe.

The invention is also directed to the process of forming a four-sided package wherein the leadframe has an aluminum cladding for improved bonding to the aluminum wires connected to the leadframe and the semiconductor die housed within the package. The aluminum cladding, which is preferably layered on both sides of the leadframe, is preferably chemically etched from the outer ends of the leadframe so that a solder stop remains near the package. The invention and further developments of the invention are now elucidated by means of the preferred embodiments in the drawings.

DETAILED DESCRIPTION OF THE DRAWINGS

Figure 1:
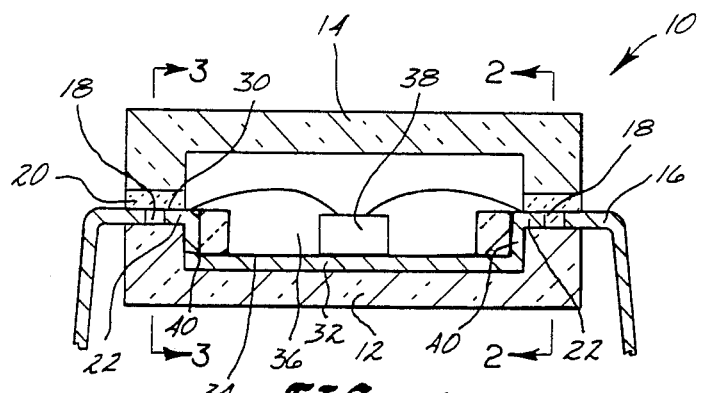
FIG. 1 illustrates a ceramic package in accordance with the present invention.

The present invention is directed to a semiconductor casing 10 comprising a base component 12 and a lid component 14, both of which are formed of a ceramic-glass-metal composite material. The composite has a structure comprising substantially a matrix of glass with ceramic particles and metal particles dispersed therein. A metallic leadframe 16 is embedded into the base component 12. The leadframe 16 has at least one hole 18 extending therethrough with the composite material therein. The hole 18 provides an increased bonding area so that the leadframe 16 is interlocked into the composite material of the base member 12. A sealing glass 20 bonds the base component 12 to the lid component 14.

The present invention takes advantage of the unique properties which are obtained by incorporating the ceramic-glass-metal composite as disclosed in U.S. patent application Ser. No. 924,970. In general, the ceramic is provided in powder or particle form in a volume percent range selected according to the desired physical property requirements such as the mechanical, electrical, thermal and chemical properties. Typically, ceramics are known for their physical characteristics including high strength, low ductility, high dielectric constant, low coefficient of thermal expansion and chemical nonreactivity. The second material is a glass, which forms a matrix for binding the ceramic and the third material, metallic particles together. Since glass is relatively fragile, it is typically provided at such a proportion so as to prevent a significant reduction of the composite strength, primarily provided by the ceramic particles. The glass is selected to be chemically reactive with the ceramic particles as well as with the third material, metal or alloy particles. The third material is comprised of metal or alloy particles which are dispersed throughout the composite. The metal or alloy particles enable the ceramic particles to shift position, while the composite is being pressed into a desired shape at the processing temperature, with less applied pressure as compared to a ceramic-glass slurry alone.

The ceramic material typically comprises particles selected for their physical characteristics. The specific ceramic may be selected from the group consisting of $Al_2O_3$, SiC, BeO, $TiO_2$, $ZrO_2$, MgO, AlN, $Si_3N_4$, BN and mixtures thereof. The present invention is not limited to these ceramics and may incorporate any desired ceramic or mixture of ceramics. The ceramic particles are present in a range of from about 20 to about 80 volume percent of the final fired composite and in a preferred range of from about 40 to about 65 volume percent. The ceramic particles can have any desired shape and have an average diameter of over about 1 micron, preferably, between about 1 to about 200 microns and most preferably, between about 40 to about 100 microns. The factors considered in selecting the desired ceramic include its dielectric constant, its coefficient of thermal expansion, its strength and chemical durability.

A second component of the composite comprises a glassy phase having any desired composition in accordance with the properties required by the final composite. The glassy phase functions to bind the ceramic and metallic particles together within a matrix of the glass. An important characteristic is that the glass preferably is chemically reactive with both the ceramic and metallic particles. Also, it may be important that the glass has physical characteristics such as good chemical durability, high strength, an acceptable dielectric constant, and a softening point in a selected temperature range. Suitable glasses may be selected from the group consisting of silicate, borosilicate, phosphate, zinc-borosilicate, soda-lime-silica, lead-silicate and lead-zinc-borate glasses, however, any desired glass may be utilized. They may include phosphate glass systems having high coefficients of thermal expansion and relatively low temperature softening points. In addition, a vitreous or devitrified glass may be selected.

The third component of the composite comprises metallic particles which preferably are ductile at the processing temperature. The metallic particles are provided for their ability to reduce significantly the pressure necessary to densify the final composite product. It is believed that they mold about the surfaces of the ceramic particles when they are pressed between the ceramic particles during the processing procedures, thereby reducing or eliminating interlocking of the ceramic particles so as to reduce processing pressures.

The metallic particles may be constituted of any metal or alloy which does not melt at the processing temperature of the composite. Preferably, the metals and alloys are selected from the group consisting of aluminum, copper, iron, silver, gold, stainless steel and alloys thereof. Preferably, the selected metals and alloys are ductile at the processing temperature. Since any metal or alloy is ductile slightly below its melting temperature and below its solidus, respectively, a suitably selected processing temperature enables the use of any metal or alloy which will be ductile at the latter temperature. In the case where the metal or alloy is not ductile enough at the processing temperature, added pressure may be applied during the forming process to provide the required deformation. The metal or metal alloy particles preferably have an average diameter between about 0.01 to about 50 microns.

The final, fired composite may either contain the metallic particles dispersed continuously or discontinuously throughout the composite. Even in the case where the metallic particles are dispersed continuously, they do not form a matrix and are primarily subject to localized sintering. When the particles are dispersed continuously, the product would be classified as electrically conductive and when the particles are dispersed discontinuously the product would typically be classified as an insulator.

The metallic particles are present in the composite in an effective amount up to about 45 vol. % of the fired composite to enhance the flow characteristics of the composite at the processing temperature. Preferably, the metallic particles make up from about 5 to about 45 vol. % of the composite.

The present invention is directed to embedding a metal leadframe 16 into a base component 12 formed of the composite. This can be accomplished in a single step during the forming of the ceramic-glass-metal composite into the base component 12. The metallic leadframe 16 is preferably formed of any metal or alloy which is thermally compatible with the glassy phase in the composite. This includes copper, iron, nickel and alloys thereof. For example, the leadframe 16 may be formed of CDA 72400, 70250, 63800, 19400, 42Ni - 58Fe. Although examples of suitable alloys have been disclosed, any metal or alloy capable of being embedded into the ceramic-glass-metal composite may be used. If the metallic leadframe does not adhere to the glassy phase, it may be appropriate to place an adherent coating on the surface of the leadframe to accomplish the same purpose. Examples of suitable metals include the group consisting of nickel, copper, aluminum, iron, gold, silver and alloys thereof.

Figure 2:
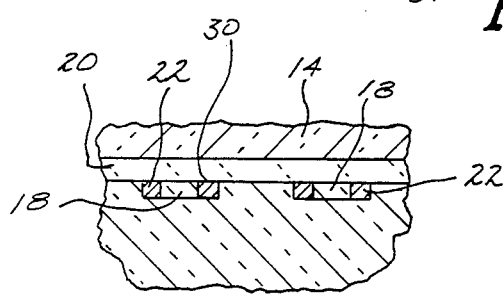
FIG. 2 illustrates a cross-sectional view through section 2—2 of FIG. 1 illustrating holes in a leadframe embedded in a substrate.
Figure 3:
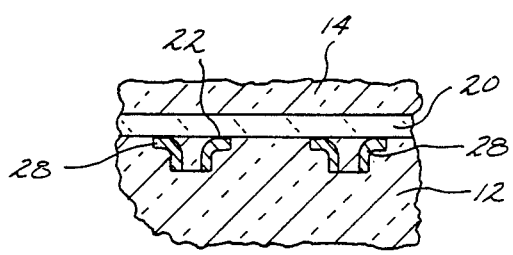
FIG. 3 illustrates a cross-sectional view through section 3—3 of FIG. 1 illustrating pierced holes in a leadframe embedded in a substrate.

As mentioned hereinbefore, one of the weakest elements of a hermetically sealed glass package is the glass seal. Flexure of the leadframe caused by handling may fracture the glass seal. The present invention overcomes this weakness by embedding the leadframe 16 into the base component 12. To further strengthen the bond between the leadframe and the ceramic-glass-metal composite material which forms the base component 12, one or more holes 18 may be provided in the leads 22 of the leadframe 16 so that the composite material flows through the holes 18 during the forming process and physically interlocks the leadframe 16 into position within the base component 12. As seen in FIGS. 1 and 2, each of the leads 22 may have a hole 18 disposed therein. The holes actually increase the bonded area of the leads 22. Another embodiment, as shown in FIG. 3, further increases the bonded area by piercing the holes 18 in the leads 22 of the leadframe 16 with a pointed punch so as to form a collar 28 which further increases the area bonded with the ceramic-glass-metal material. Although the leadframe 16 is indicated as being embedded into the base component 12 with its surface 30 flush with the top surface of the base component 12, it is also within the terms of the present invention to fully embed the leadframe 16 within the base component 12 so that the sealing glass 20 is bonded to the composite material of the base component 12 and the lid component 14.

Another aspect of the present invention is directed to the metallic pad 32 embedded in the base component 12 with a surface 34 exposed to a cavity 36 formed in the base component 12. The pad 32 is adapted to have a semiconductor device 38 bonded thereto by any conventional means. The pad 32 is preferably formed as a unitary part of the leadframe 16 and is connected to leads 22 by legs 40. The pad 32 is preferably larger than the cavity 36 and is, therefore, embedded in the base component 12 by the composite material which flows inward and over the ends of the pad 32 as seen in FIG. 1. It should be noted, that the mounting pad 32 is similar to the type used for plastic packages and does not have to be separated from the leadframe 16.

Figure 4:
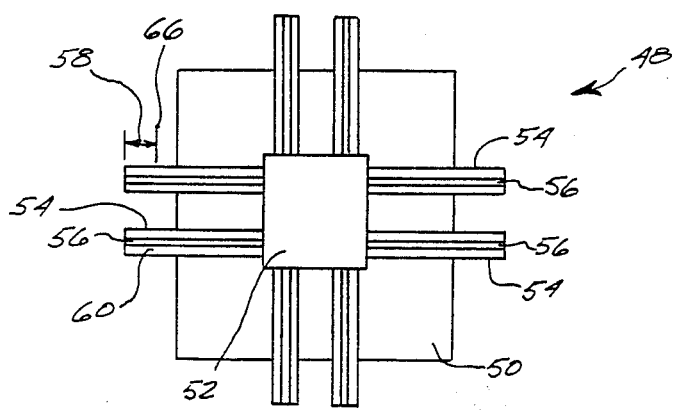
FIG. 4 illustrates a plan view of four-died ceramic-glass-metal composite base having a leadframe embedded therein.
Figure 5:
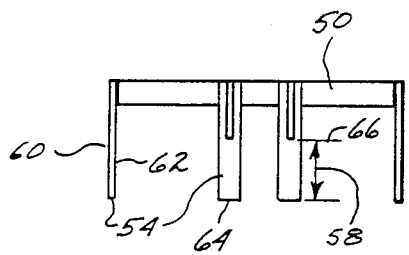
FIG. 5 illustrates a side view of the composite base of FIG. 4 with bent leads.

Another embodiment of the present invention is directed to a four-sided semiconductor package 48 as shown in FIGS. 4 and 5. As described hereinbefore, the leadframes typically used for four-sided packages are typically fabricated from a low expansivity iron-nickel alloy which has an aluminum stripe applied by the process of roll cladding or a vapor deposition. The aluminum stripe provides an aluminized surface in the areas to which the aluminum wires are subsequently bonded. In the case of four-sided packages, it is necessary to apply the aluminum spot by vapor deposition in the center of the leadframe. If stripe material were used, the aluminum stripe on the leads external to the package would interfere with soldering (solder does not typically bond to aluminum). Aluminum can be chemically removed from the surface since the cladding is usually very thin, i.e. about 2 mils and could be removed from the surface of the leads with an etching solution such as sodium hydroxide. However, the chemical resistance of the sealing glasses currently being used is quite poor and the etchants would severely attack the sealing glass. Thus, with existing technology, the aluminum striped clad material cannot be used with a single strip of leadframe on four-sided packages and the relatively expensive approach of spot aluminum coating is relied upon. The ability to remove aluminum from unwanted areas on the leads external to the semiconductor package becomes both a means to improve quality, since the roll clad material is superior to vapor depositing material as well as a means to reduce cost.

Another factor to be considered is that with the leads being closely spaced from each other, it may be desirable to carefully control the amount of solder which is bonded to the surface of each lead. Since solder does not bond to aluminum, the aluminum can, if selectively positioned, form a solder barrier.

Referring again to FIG. 4, there is illustrated a base component 50 formed of the ceramic-glass-metal composite as described hereinbefore. The base component includes a cavity 52. Leads 54 are embedded into the base component 50 in the manner described hereinbefore with regards to FIG. 1. The leads 54 may extend to the cavity 52 and external to the base component 50. It is also within the terms of the present invention, to have the ends of the lead 54 bend near the cavity 52 as illustrated in FIG. 1. Also, if desired, a pad (not shown) may be provided in the bottom of the cavity 52 similar to that illustrated in FIG. 1. Each of the leads 54 is provided with at least a layer of cladding on the top surface 60 of lead 54. The layer of cladding may be a stripe 56 of aluminum or an aluminum alloy. It is also within the terms of the present invention to provide a layer of cladding which completely covers a top surface 60 of a lead 54 and thereby forms a bi-clad (not shown). It is, moreover, within the terms of the present invention, to form a tri-clad with first and second layers of aluminum or aluminum alloy cladding disposed on both the top surface 60 and the bottom surface 62 of a lead material such as 42Ni - 58Fe or any other desired leadframe material as described hereinbefore.

Once the leads 54 are embedded into the base component 50, as illustrated in FIG. 5, at least a section 58 of the ends of the leads 54 extending outward from the base component 50 are selectively etched to remove at least the first layer of aluminum cladding disposed thereon. The section 58 extends from the outermost end 64 of the leads 54 to a point 66 closer to the base component 50.

The etchant may be of any desired solution such as sodium hydroxide. However, it may have to be selectively applied to the leadframe so as to have minimal contact with the base component which contains a glass that could be attacked by the etchant solution. Therefore, it may be desirable to bend the ends of the leads prior to the step of etching, as seen in FIG. 5, so that the leads can be dipped into a solution of etchant without the etchant having substantial contact with the base component 50. It is believed that contact of the etchant with the base component may not have any significant effect since the glass may be devitrified and, therefore, contain a very small amount of the glassy phase.

Figure 6:
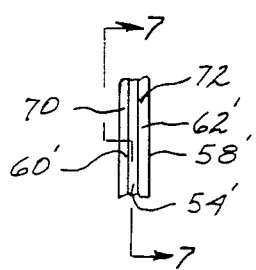
FIG. 6 illustrates a side view of a tri-clad lead in accordance with the present invention.
Figure 7:
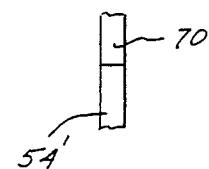
FIG. 7 is a view through 7—7 of FIG. 6.

Referring to FIG. 6, there is illustrated an embodiment of the present invention wherein a lead 54' has a first layer of aluminum cladding 70 on surface 60' and a second layer of aluminum cladding 72 on a surface 62' to form a tri-clad lead. Although FIG. 6 illustrates only the portion of the lead which is external to the package, it is within the terms of the present invention to form the tri-clad on the entire lead structure used for a four-sided semiconductor package or any other desired type of semiconductor package such as, for example, a two-sided semiconductor package known as a CERDIP. Once the end portion 58' of the lead 54' has been etched, the aluminum clad remains on both surfaces 60' and 62' above the portion 58'. This remaining aluminum clad serves the function of a solder stop as illustrated in FIG. 7. This feature may be advantageous when the leads are close together and it is desired to prevent the solder from bridging to an adjacent lead. Also, the solder might have a propensity to bond to the base component since it does contain metal particles. The solder stop also prevent this from occurring.

The patent and patent applications set forth in this application are intended to be incorporated in their entireties by reference herein.

It is apparent that there has been provided in accordance with this invention ceramic-glass-metal packaging for electronic components incorporating unique leadframe designs which satisfies the objects, means and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications and all variations as fall within the spirit and broad scope of the appended claims.

We claim:

1. A semiconductor casing, comprising:
    a base component formed of a ceramic-glass-metal composite material;
    a lid component formed of a ceramic-glass-metal composite material;
    said composite having a structure comprisinq substantially a matrix of glass with ceramic particles and metallic particles dispersed therein;
    a metallic leadframe embedded into said base component, said leadframe having at least one hole therethrough with said composite material therein whereby the bonded area of said leadframe is increased and said leadframe is interlocked in said composite material of said base member; and
    a sealing glass bonding said base component to said lid component.

2. The semiconductor casing of claim 1 wherein said at least one hole in said leadframe has a collar extending out of the plane through the surface of the leadframe to increase the bonded area as compared to that of the hole without a collar.

3. The semiconductor casing of claim 2 further including said base component having a cavity adapted to receive a semiconductor device,
a metallic pad embedded in said base component with a surface exposed to said cavity, said pad being adapted to have a semiconductor device bonded thereto, said metallic pad being a part of said leadframe.

4. The semiconductor casing of claim 3 further including said metallic pad being larger than said cavity whereby the edges of said pad are completely surrounded by said composite material.

5. The semiconductor casing of claim 1 wherein said leadframe is completely embedded by said composite material.

6. The semiconductor casing of claim 1 wherein said composite material comprises an effective amount up to about 25 volume % of metallic particles for enhancing the flow characteristics of said composite;
from about 15 to about 50 volume % of a lass for adhering said composite together; and the balance essentially ceramic particles.

7. The semiconductor casing of claim 6 including said ceramic particles comprising from about 20 to about 80 vol. percent of said composite.

8. The semiconductor casing of claim 7 including said ceramic particles being selected from the group consisting of $Al_2O_3$, SiC, BeO, $TiO_2$, $ZrO_2$, MgO, AlN, $Si_3N_4$, BN and mixtures thereof.

9. The semiconductor casing of claim 8 including said metallic particles being selected from the group consisting of aluminum, copper, iron, silver, gold, stainless steel and alloys thereof.

10. The semiconductor casing of claim 9 further including the glass matrix being from the group consisting of vitreous and devitrified glass.

11. The semiconductor casing of claim 10 including said glass matrix being selected from the group consisting of silicate, borosilicate, phosphate, zinc-borosilicate, soda-lime-silica, lead-silicate and lead-zinc-borate glasses.

12. The process of forming a semiconductor casing, comprising the steps of:
providing a base component having a cavity adapted to receive a semiconductor device and a lid component, said base and lid components formed of a ceramic-glass-metal composite material;
said composite material having a structure comprising substantially a matrix of glass with ceramic particles and metal particles dispersed therein;
providing a metallic leadframe having at least one hole therethrough to receive said composite material whereby the area bonded to the composite material is increased;
embedding said leadframe into said base component whereby said composite material is pressed into said at least one hole so that said leadframe is interlocked in said composite material of said base member;
disposing a sealing glass between said base component and said lid component;
heating said lid component, said base component and said sealing glass to a temperature where said sealing glass is in the liquid state;
pressing said base and lid components together; and
solidifying said sealing glass to bond said base component to said lid component.

13. The process of claim 12 further including the step of forming said at least one hole in said leadframe with a collar extending out of the plane through the surface of the leadframe to increase the bonded area as compared to that of a hole without a collar.

14. The process of claim 12 further including the step of completely embedding said leadframe with said composite material.

15. The process of claim 12 wherein said composite material comprises an effective amount up to about 25 volume % of metallic particles for enhancing the flow characteristics of said composite:
from about 15 to about 50 volume % of a glass for adhering said composite together; and the balance essentially ceramic particles.

16. The process of claim 15 including the step of selecting said ceramic particles to comprise from about 20 to about 80 vol. percent of said composite.

17. The process of claim 16 including the step of selecting said ceramic particles from the group consisting of $Al_2O_3$, SiC, BeO, $TiO_2$, $ZrO_2$, MgO, AlN, $Si_3N_4$, BN and mixtures thereof.

18. The process of claim 17 including the step of selecting said metallic particles from the group consisting of aluminum, copper, iron, silver, gold, stainless steel and alloys thereof.

19. The process of claim 18 further including the step of selecting the glass for adhering said composite from the group consisting of vitreous and devitrified glass.

20. The process of claim 19 further including the step of selecting said glass matrix from the group consisting of silicate, borosilicate, phosphate, zinc-borosilicate, soda-lime-silica, lead-silicate and lead-zinc-borate glasses.

21. The process of forming a semiconductor casing, comprising the steps of:
providing a base component having four-sides formed of a ceramic-glass-metal composite material, said composite material having a structure comprising substantially a matrix of glass with ceramic particles and metal particles dispersed therein;
providing a metallic leadframe, said leadframe comprising a plurality of leads having a first layer of aluminum cladding on at least one surface of the leadframe extending along the length of the leads;
embedding said leadframe into said base component whereby the ends of said leads extend outward from four sides of said base component; and
selectively etching the first layer of aluminum cladding from at least a section of the ends of said leads extending outward from said base component, said section extending from an outermost end of the leads to a point closer to the base component.

22. The process of claim 21 including the step of bending the ends of said leads prior to the step of etching whereby the ends of said leads can be dipped into a solution of etchant without the etchant having substantial contact with said base component.

23. The process of claim 22 including the steps of selecting said leadframe with a second layer of aluminum cladding on a second surface of the leadframe, said second layer extending along the length of the leads; and selectively etching the second layer of aluminum cladding from said section of the ends of said leads extending outward from said base component, whereby said section of the first layer of aluminum cladding and the second layer of aluminum cladding remains to form a solder stop on said leads.

24. The process of claim 22 including the step of forming said first layer of aluminum cladding as a stripe.

25. The process of claim 22 including the step of providing said leadframe having at least one hole therethrough having said composite material therein whereby the area bonded to the composite material is increased.

26. The process of claim 25 further including the step of forming said at least one hole in said leadframe with a collar extending out of the plane through the surface of the leadframe to increase the bonded area as compared to that of the hole without a collar.

27. The process of claim 25 further including the step of completely embedding said leadframe with said composite material.

* * * * *